(12) United States Patent
Haukka et al.

(10) Patent No.: US 7,704,896 B2
(45) Date of Patent: Apr. 27, 2010

(54) ATOMIC LAYER DEPOSITION OF THIN FILMS ON GERMANIUM

(75) Inventors: Suvi P. Haukka, Helsinki (FI); Marko Tuominen, Helsinki (FI); Antti Rahtu, Vantaa (FI)

(73) Assignee: ASM International, N.V. (NL)

( * ) Notice: Subject to any disclaimer, the term of this patent is extended or adjusted under 35 U.S.C. 154(b) by 821 days.

(21) Appl. No.: 11/336,621

(22) Filed: Jan. 20, 2006

(65) Prior Publication Data

US 2006/0292872 A1    Dec. 28, 2006

Related U.S. Application Data

(60) Provisional application No. 60/645,931, filed on Jan. 21, 2005.

(51) Int. Cl.
*H01L 21/31* (2006.01)
(52) U.S. Cl. .............. 438/785; 257/E21.274; 257/E21.28; 438/758
(58) Field of Classification Search ......... 438/680, 438/785
See application file for complete search history.

(56) References Cited

U.S. PATENT DOCUMENTS

| | | | |
|---|---|---|---|
| 4,828,224 A | 5/1989 | Crabb | |
| 5,221,556 A | 6/1993 | Hawkins | |
| 6,093,252 A | 7/2000 | Wengert | |
| 6,420,279 B1 | 7/2002 | Ono et al. | |
| 6,444,592 B1 | 9/2002 | Ballantine et al. | |
| 6,613,695 B2 | 9/2003 | Pomarede et al. | |
| 6,875,279 B2 | 4/2005 | Chu et al. | |
| 7,306,956 B2 * | 12/2007 | Kuse ............... | 438/14 |
| 2003/0045063 A1 | 3/2003 | Oda | |
| 2003/0082300 A1 | 5/2003 | Todd et al. | |
| 2003/0124818 A1 | 7/2003 | Luo et al. | |
| 2003/0157787 A1 | 8/2003 | Murthy et al. | |
| 2003/0207127 A1 | 11/2003 | Murthy et al. | |
| 2003/0235931 A1 | 12/2003 | Wada et al. | |
| 2004/0214399 A1 | 10/2004 | Ahn et al. | |

(Continued)

FOREIGN PATENT DOCUMENTS

EP    0858101    2/1998

(Continued)

OTHER PUBLICATIONS

Cannon, D. et al., "Tensile strained epitaxial Ge films on Si(100) substrates with potential application in L-band telecommunications," Applied Physics Letter, vol. 84, No. 6, Feb. 9, 2004, pp. 906-908.

(Continued)

*Primary Examiner*—Alexander G Ghyka
(74) *Attorney, Agent, or Firm*—Knobbe, Martens, Olson & Bear LLP

(57) ABSTRACT

Germanium has higher mobility than silicon and therefore is considered to be a good alternative semiconductor for CMOS technology. Surface treatments a can facilitate atomic layer deposition (ALD) of thin films, such as high-k dielectric layers, on germanium substrates. Surface treatment can comprise the formation of a thin layer of $GeO_x$ or $GeO_xN_y$. After surface treatment and prior to deposition of the desired thin film, a passivation layer may be deposited on the substrate. The passivation layer may be, for example, a metal oxide layer deposited by ALD.

23 Claims, 3 Drawing Sheets

U.S. PATENT DOCUMENTS

| | | |
|---|---|---|
| 2004/0219735 A1 | 11/2004 | Brabant |
| 2005/0079692 A1 | 4/2005 | Samoilov et al. |
| 2005/0106893 A1* | 5/2005 | Wilk .......................... 438/758 |
| 2005/0186342 A1* | 8/2005 | Sager et al. ............... 427/248.1 |
| 2007/0170541 A1* | 7/2007 | Chui et al. .................. 257/506 |

FOREIGN PATENT DOCUMENTS

| | | |
|---|---|---|
| WO | WO 00/15885 | 3/2000 |

OTHER PUBLICATIONS

Colace, L. et al., "Efficient high-speed near-infrared Ge photodetectors integrated on Si substrates," Applied Physics Letters, vol. 76, No. 10, Mar. 6, 2000, pp. 1231-1233.

Colace, L. et al., "Ge-on-Si Approaches to the Detection of Near-Infrared Light," IEEE Journal of Quantum Electronics, vol. 35, No. 12, Dec. 1999, pp. 1843-1852.

Fama, S. et al., "High performance germanium-on silicon detectors for optical communications," Applied Physics Letters, vol. 81, No. 4, Jul. 22, 2002, pp. 586-588.

Hull, R., "Metastable strained layer configurations in the SiGe/Si System," (1999) *EMIS Datareviews, Series No. 24 of SiGe and SiGe:C*, edited by Erich Kasper et al., INSPEC (2000), London, UK.

Ishikawa, Y. et al., "Strain-induced band gap shrinkage in Ge grown on Si substrate," Applied Physics Letters, vol. 82, No. 12, Mar. 31, 2003, pp. 2044-2046.

Lee et al., "Growth of strained Si and strained Ge heterostructures on relaxed $Si_{1x}$, $G_{ax}$Gaby ultrahigh vacuum chemical vapor deposition," J. Vac. Sci. Technol. B 22(1) (Jan./Feb. 2004).

Li, Q, et al., "Selective growth of Ge on Si(100) through vias of SiO2 nanotemplate using solid source molecular beam epitaxy," Applied Physics Letters, vol. 83, No. 24, Dec. 15, 2003, pp. 5032-5034.

Liu, J. et al., "Silicidation -induced band gap shrinkage in Ge epitaxial films on Si," Applied Physics Letters, vol. 84, No. 5, Feb. 2, 2004, pp. 660-662.

Masini, G. et al., "High-Performance p-i-n. Ge on Si Photodetectors for the Near Infrared: From Model to Demonstration, " IEEE Transactions of Electron Devices, vol. 48, No. 6, Jun. 2001, pp. 1092-1096.

Schollhorn et al., "Coalescence of geranium islands on silicon, "Thin Solid Films, vol. 336 (1988), pp. 109-111.

Bai et al., "Ge MOS Characteristics with CVD HfO2 Gate Dielectrics and TaN Gate Electrode", VLSI Technology Digest of Technical Papers 121-122 (2003).

* cited by examiner

ATOMIC LAYER DEPOSITION OF THIN FILMS ON GERMANIUM

REFERENCE TO RELATED APPLICATIONS

The present application claims priority under 35 U.S.C. §119(e) to U.S. Provisional Application No. 60/645,931, filed Jan. 21, 2005, which is hereby incorporated by reference. The present application is also related to U.S. application Ser. No. 10/910,551, filed Aug. 3, 2004, which is also incorporated by reference herein.

BACKGROUND OF THE INVENTION

1. Field of the Invention

The present invention relates to the formation of integrated circuits, more particularly to the deposition of thin films on germanium substrates.

2. Description of the Related Art

Gate dielectrics comprising high-k oxide deposited on silicon have been shown to provide the low leakage current and low equivalent oxide thickness (EOT) values required for the down-scaling of semiconductor feature size. The tradeoff, however, is much decreased mobility. Both the hole and electron mobility in germanium is higher than in silicon (Table 1). As a result, it has been considered as a possible alternative semiconductor for MOSFET's. In addition, it has been suggested that the narrower band gap (0.66 vs 1.12 eV) may be beneficial when scaling down operation voltages. The smaller optical band gap for Ge broadens the absorption wavelength spectrum, allowing optoelectronic integration to enhance CMOS functionality.

TABLE 1

Selected electrical properties of silicon and germanium.

|  | Ge | Si |
| --- | --- | --- |
| Band gap [eV] | 0.66 | 1.12 |
| electron mobility [$cm^2/V \cdot s$] (at 300 K) | 3900 | 1450 |
| Hole mobility [$cm^2/V \cdot s$] (at 300 K) | 1800 | 505 |

There are several significant physical and chemical differences between silicon and germanium that need to be taken into account in order to avoid the potential pit falls which might arise when switching processes to a new material. Germanium is between silicon and tin in the periodic table of elements. Therefore, it shares certain properties with both of these elements. Germanium has two stable oxidation states +2 and +4, of which the latter is more stable. In contrast, the +2 oxidation state is uncommon for silicon. In addition, while silicon is a semimetal, germanium has properties closer to metals.

Both hydrous germanium monoxide ($GeO \cdot xH_2O$) and germanium dioxide ($GeO_2$) are amphoteric. That is, they dissolve both in acids and bases. In addition, germanium oxide dissolves in water. On the other hand, $SiO_2$ is chemically very stable and requires particular chemicals, such as HF, to etch. Further, while germanium oxides sublime at relatively low temperature (GeO sublimes at 500° C. (780 torr)), $SiO_2$ has very low vapor pressure. While SiO has some vapor pressure at high temperature, it is formed only in harsh conditions. Thus, GeO can be reduced to germanium at temperatures as low as 500° C. while $SiO_2$ is very stable and can not be reduced to silicon with hydrogen at relatively low temperatures.

Over the years several different oxides have been deposited on Ge, including GeN, $GeO_xN_y$, $SiO_2$, $ZrO_2$, $HfO_2$, and $Al_2O_3$. These insulators have been deposited by thermal nitridation and oxidation, MBE, CVD and atomic layer deposition (ALD). However, because germanium does not have a stable native oxide like silicon, it has not been possible to obtain films with good electrical properties. The best results to date have been obtained with native Ge oxide pretreated with ammonia followed by ALD of $HfO_2$. This structure had small flat band voltage ($V_{fb}$) shift and small hystheresis.

The instability of germanium oxides explains the poor electrical properties obtained so far. A detailed understanding of the chemistry of germanium is important for adjusting process flows to achieve good ALD growth on germanium.

SUMMARY OF THE INVENTION

Methods for depositing thin films, such as high-k dielectric layers, on Ge substrates by atomic layer deposition (ALD) are provided. The surface of the Ge substrate is preferably cleaned and/or treated to provide a uniform surface termination that facilitates subsequent deposition of a thin film by ALD. In some embodiments the treatment includes the formation of an ultra-thin layer of GeOx or $GeO_xN_y$. The surface treatment may also include etching of native oxide.

In some embodiments, a passivation layer is also used to facilitate ALD on Ge. For example, a thin metal oxide layer may be deposited over the substrate surface prior to deposition of a thin film by ALD. In preferred embodiments, surface treatment, such as the formation of GeOx or $GeO_xN_y$, and/or etching of native oxide, is combined with deposition of a passivation layer.

Following surface treatment and/or deposition of a passivation layer, a thin film is deposited over the substrate by ALD. In some embodiments the ALD process uses a metalorganic reactant and is carried out at a temperature of less than about 300° C.

DETAILED DESCRIPTION OF THE PREFERRED EMBODIMENT

Figure 1:
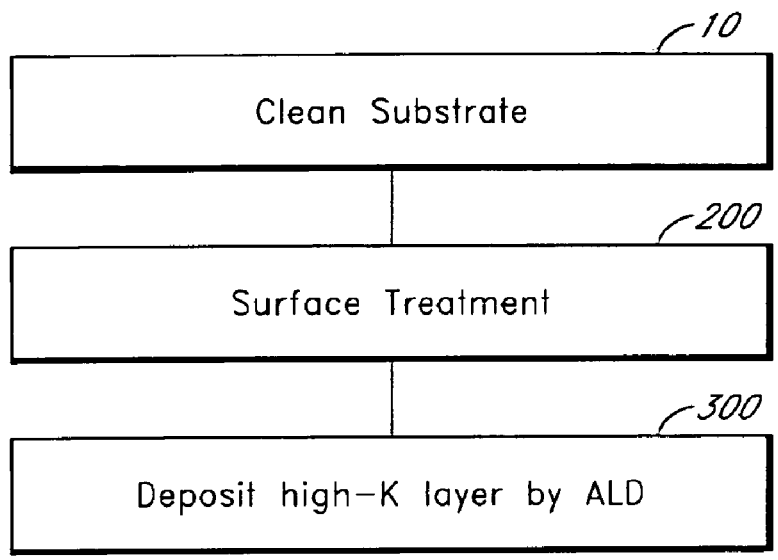
FIG. 1 is a flow chart illustrating a method for depositing a high-k dielectric layer on a Ge substrate, in which the substrate surface is cleaned and treated prior to deposition of the high-k layer by ALD.

Thin films, such as high-k dielectric layers, can be deposited on Ge substrates by ALD. However, as discussed above, native germanium oxide is not stable. Thus, in order to ensure that the deposited films have good physical and electrical properties a surface termination that provides good reactive sites for ALD growth should be maintained or provided. A number of approaches for facilitating ALD growth on germanium substrates have been identified.

According to one aspect of the invention the surface of the germanium substrate is treated to provide good reactive sites for ALD growth. The surface treatment preferably provides a uniform distribution of a surface termination, such as hydroxyl ligands, that facilitates subsequent thin film deposition by ALD. Preferred surface treatments result in the formation of a thin, uniform layer of $GeO_x$ or $GeO_xN_y$ on the substrate surface. In some embodiments, the surface treatment includes first etching the substrate to remove native oxide. Following the surface treatment, a thin film is deposited by ALD at temperatures low enough to prevent disruption of the surface termination, such as by the decomposition of germanium oxide. In some embodiments the thin $GeO_x$ or $GeO_xN_y$ layer remains in the ultimate structure and provides a good interface between the germanium substrate and a subsequently deposited thin film, such as a dielectric.

In another aspect of the invention, an ultra-thin film is used to passivate the substrate prior to deposition of a high-k dielectric. In some embodiments the passivation layer is deposited over a substrate surface that has been treated to provide a uniform distribution of the desired surface termination. For example, the passivation layer may be deposited over a $GeO_x$ or $GeO_xN_y$ layer that has been formed on the substrate surface. The passivating film can serve as an oxygen diffusion barrier. In some embodiments, an ultra-thin metal oxide or $SiGeO_x$ passivation layer is deposited on the germanium surface. The thin film may be deposited by any method known in the art, including, for example, CVD and ALD. Preferably the thin film is deposited by an ALD type process. If a thin GeOx or $GeO_xN_y$ layer has been formed on the substrate, the ALD process preferably is conducted at low enough temperatures that the surface termination is not disrupted.

The presence of an ultra-thin film, whether a germanium oxide layer or a passivation layer, provides an improved surface for subsequent deposition of a thin film by ALD, such as a high-k dielectric layer.

The interface between the Ge substrate and high-k dielectric layer or passivation layer is preferably electrically high quality. Thus, metal reactant selection for deposition of both the high-k dielectric layer by ALD and the passivation layer by ALD is made carefully. When Ge comes in contact with a halide containing reactant, such as $HfCl_4$ or $ZrCl_4$, volatile $GeCl_4$ may be formed, which can lead to etching/corroding of the Ge substrate, low quality interfaces, and undesirable electrical properties. However when a passivation layer is first deposited using non-halide containing reactants, the high-k dielectric layer may subsequently be deposited from halide containing precursors, such as $HfCl_4$ or $ZrCl_4$.

While illustrated in the particular context of deposition of high-k dielectric layers in transistor structures, the skilled artisan will readily find application for the principles and advantages disclosed herein in other contexts.

Deposition of a Gate Oxide

Prior to deposition, the germanium substrate is preferably cleaned. In some embodiments, this may be done ex situ using liquid and/or gas treatment methods known in the art. For example, and without limitation, the substrate may be treated with acids, such as HF and HCl acids, high temperature $O_2$ and/or $N_2$, forming gas treatment, or plasma comprising radicals such as $N^*$, $H^*$, $O^*$ and $NH_x^*$.

Following cleaning, the substrate is preferably subject to surface treatment to generate a uniform distribution of reactive sites that are suitable for deposition of a high-quality thin film by ALD. This surface treatment results in good nucleation of the ALD deposited film, a sharp interface and a film with good electrical properties. In preferred embodiments the thin film to be deposited is a high-k dielectric layer in a gate stack.

In preferred embodiments, the treatment comprises exposing the substrate to at least one gas or liquid reactant to form germanium oxide ($GeO_x$) or germanium oxynitride ($GeO_xN_y$), preferably uniformly across the Ge surface. In some embodiments the surface treatment comprises etching native oxide on the substrate prior to generation of reactive sites. For example, native oxide may be etched prior to formation of $GeO_x$, $GeO_xN_y$.

The surface treatment is preferably carried out in situ, although for some of the treatments described herein, ex situ processing may be used.

Surface treatment may comprise, for example and without limitation, exposing the cleaned germanium substrate to one or more reactants selected from the group consisting of $O_3$, $NH_3$, $H_2O$, $C_2H_5OH$, $HNO_3$, $H_2O_2$, $H_3PO_4$, germanium compounds such as $GeCl_4$, $Ge(CH_3)_4$, silicon compounds such as $SiCl_4$, radicals such as $N^*$, $H^*$, $O^*$ and $NH_x^*$, acids such as HCl and HF, and combinations of reactants such as a halide compound plus TEOS. In some embodiments the reactants are in aqueous solution, while in other embodiments gaseous reactants are utilized. The skilled artisan will be able to determine the preferred form based on the particular circumstances.

The surface treatment is followed by deposition of a thin film by ALD, such as a layer of high-k material. However, in some embodiments there may be intervening steps, such as the formation of a passivation layer as described below. The high-k layer is preferably less than about 200 angstroms, more preferably less than about 100 angstrom, most preferably from about 10 to 50 angstroms thick.

In some embodiments the substrate surface is passivated prior to deposition of the high-k layer. The passivation layer protects the substrate from damage that would otherwise result from subsequent deposition processes, such as deposition of the high-k layer. The substrate surface may have been treated as described above prior to deposition of the passivation layer to provide a uniform distribution of reactive sites. This treatment may have included or consisted of etching to remove native oxide. In other embodiments the substrate surface may comprise native oxide. In a preferred embodiment, the substrate surface is treated prior to forming the passivation layer and comprises a uniform thin layer of GeOx or $GeO_xN_y$.

The passivation typically comprises an ultra-thin layer deposited on the substrate. The ultra-thin layer is preferably less than about 15 angstroms, more preferably less than about 10 angstrom, most preferably from about 4 to 10 angstroms thick Preferred materials for the passivation layer include, for example and without limitation, oxides such as $Al_2O_3$, MgO, $SiO_2$, $GeO_2$, $La_{(2-x)}Al_xO_3$, silicates (Hf; Nb, Ta, Ti, Zr), germanates, oxynitrides, $SiGeO_x$ and nitrides, such as AlN, $Si_3N_4$ and $Ge_3N_4$. Appropriate reactants, including metal reactants and other reactants, such as oxygen and/or nitrogen containing reactants, can be selected by the skilled artisan based on the guidance provided herein and the general knowledge in the art. In some embodiments, the passivation layer is preferably deposited from metalorganic precursors.

In one particular embodiment the passivation layer comprises $SiGeO_x$. In other particular embodiments the passivation layer comprises $Al_2O_3$ or MgO. $Al_2O_3$ is preferably deposited from trimethyl aluminum (TMA), while MgO is preferably deposited from a cyclopentadienyl precursor. Preferably, the ultra-thin passivation layer has a different composition from the high-k layer that is subsequently deposited by ALD.

The passivation layer may be deposited by any method known in the art. In preferred embodiments, the passivation layer is deposited by ALD. In other embodiments the passivation layer is deposited by CVD. The deposition temperature of the passivation layer is preferably less than about 300° C., more preferably less than about 250° C. In some cases, depending on the deposition chemistry, temperatures below 200° C. can be used. When low deposition temperatures are used and the passivation layer comprises oxygen, an oxygen donor reactant is preferably chosen from the group consisting of ozone, oxygen containing radicals or oxygen containing plasma.

If a passivation layer is utilized, the increased stability of the material of the passivation layer compared to germanium oxide may allow for the use of a higher deposition temperature for the subsequent deposition by ALD of the high-k layer than can be used in the absence of a passivation layer. The actual deposition temperature can be readily determined by the skilled artisan based on the material of the passivation layer and the deposition process for forming the high-k dielectric layer.

Following surface treatment and/or passivation, a thin film is deposited by ALD. Preferably, the thin film deposition is carried out in situ with the surface treatment and any intervening steps. However, for some of the methods described herein the same benefits can be realized with ex situ processing.

In preferred embodiments the thin film comprises a high-k material. A high-k material preferably has a k value greater than about 10. For example, and without limitation, the high-k material may be selected from the group consisting of $Al_2O_3$, $HfO_2$, $Nb_2O_5$, $Ta_2O_5$, $TiO_2$, $ZrO_2$, $Sc_2O_3$, $Y_2O_3$, $La_{(2-x)}Al_xO_3$, silicates (Hf, Nb, Ta, Ti, Zr), oxynitrides thereof and mixtures of binary oxides. When an underlying passivation layer is not present, the high-k thin film is preferably deposited by a metalorganic ALD process using, for example, cyclopentadienyl (Cp) compounds, metal alkylamides or other non-halide or non-chloride containing compounds as metal reactants. Metal reactants are preferably selected from the group consisting of rare earth β-diketonates or derivates thereof, such as thd- and acac-compounds of Sc, Y, La, Ce, Pr, Nd, Sm, Eu, Gd, Tb, Dy, Ho, Er, Tm, Yb and Lu, and cyclopentadienyl compounds (—Cp, —$C_5H_5$) and derivates of those, such as cyclopentadienyl-, methylcyclopentadienyl-, ethylcyclopentadienyl-, and isopropylcyclopentadienyl compounds of Hf, Ta, Ti, Nb, Zr, Sc, Y, La, Ce, Pr, Nd, Sm, Eu, Gd, Tb, Dy, Ho, Er, Tm, Yb and Lu. Metal reactants may also be selected from the group of cyclopentadienyl compounds of Hf and Zr, such as $(CH_3)_2Hf(Cp)_2$ and $(CH_3)_2Zr(Cp)_2$. Oxygen and/or nitrogen donor reactants may be, for example, ozone, $H_2O$, $NH_3$, $O_2$ or $N_2$ or $O_2$ plasma/radicals. In one embodiment, $Al_2O_3$ is deposited by ALD from TMA and ozone, preferably at low temperature. When a passivation layer is deposited prior to deposition of the high-k layer, metal halide reactants, such as $TiCl_4$, $HfCl_4$, $ZrCl_4$ and $TaCl_5$ can be used in the deposition of high-k layer.

In the absence of a passivation layer. deposition of the high-k material is preferably conducted at a temperature that is low enough to prevent disrupting the surface termination. Thus, in some preferred embodiments the deposition temperature is below the temperature at which $GeO_x$ and/or $GeO_xN_y$ decompose. In one embodiment the deposition temperature is preferably less than about 300° C., more preferably less than about 250° C. In some cases, depending on the particular deposition chemistry, temperatures below 200° C. can be used. When low deposition temperatures are used the oxygen donor reactant is preferably chosen from the group consisting of ozone, oxygen containing radicals and oxygen containing plasma. When a passivation layer is used, the high-k material can be deposited at temperatures greater than 300° C.

Deposition of the high-k material can be followed by an annealing step, as is well known in the art. For example, the high-k layer may be annealed in the presence of $NH_3$.

A metal electrode is subsequently deposited over the high-k layer. The metal electrode may comprise, for example and without limitation, metal, metal nitrides, metal carbides. Examples include Ir, Ru, TiN, TaN, WC and WNC. The metal electrode is preferably deposited by ALD. However, other deposition processes can be used.

FIG. 1 illustrates one general method for depositing a high-k dielectric layer on a Ge substrate. The substrate is cleaned 10 and then treated 200 to provide a uniform distribution of reactive sites. The surface treatment 200 may optionally include a step of etching the surface to remove native oxide. Preferably, the surface treatment 200 comprises exposure to an oxidizing agent and generates a thin, uniform layer of $GeO_x$ or $GeO_xN_y$. Following surface treatment 200 a high-k layer is deposited by ALD 300. The substrate may then be annealed and a metal electrode deposited over the high-k layer (not shown). Surface treatment 200 and deposition of the high-k layer 300 are preferably carried out in situ.

Figure 2:
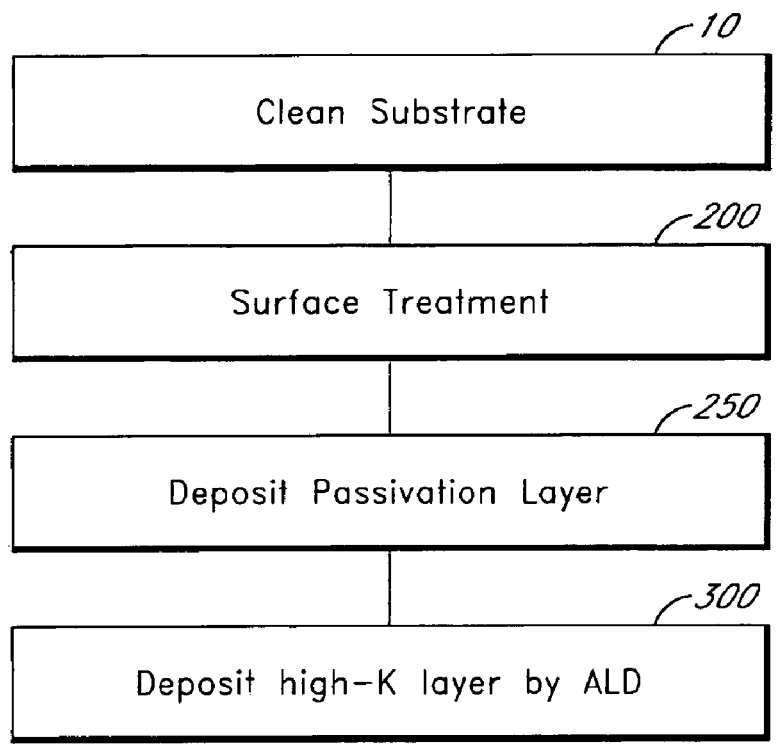
FIG. 2 is a flow chart illustrating another method for depositing a high-k dielectric layer on a Ge substrate, in which a passivation layer is deposited after surface treatment and prior to deposition of the high-k layer by ALD.

Another deposition method is illustrated in FIG. 2. Again, the substrate is cleaned 10 and the surface treated 200. The surface treatment may comprise formation of a layer of germanium oxide or germanium oxynitride. After surface treatment 200, which may optionally include etching of the native oxide, a passivation layer is deposited 250. The passivation layer is preferably an ultra-thin metal oxide, such as $Al_2O_3$ or MgO. The passivation layer is preferably deposited by ALD. A high-k layer is subsequently deposited 300 over the passivation layer by ALD. The high-k layer is preferably a different material than the passivation layer. Following deposition of the high-k layer 300, the substrate may be annealed and a metal electrode can be deposited over the high-k layer (not shown). The surface treatment 200 and deposition of the passivation layer are preferably carried out in situ. More preferably, surface treatment 200, deposition of the passivation layer 250 and deposition of the high-k layer are carried out in situ.

Figure 3:
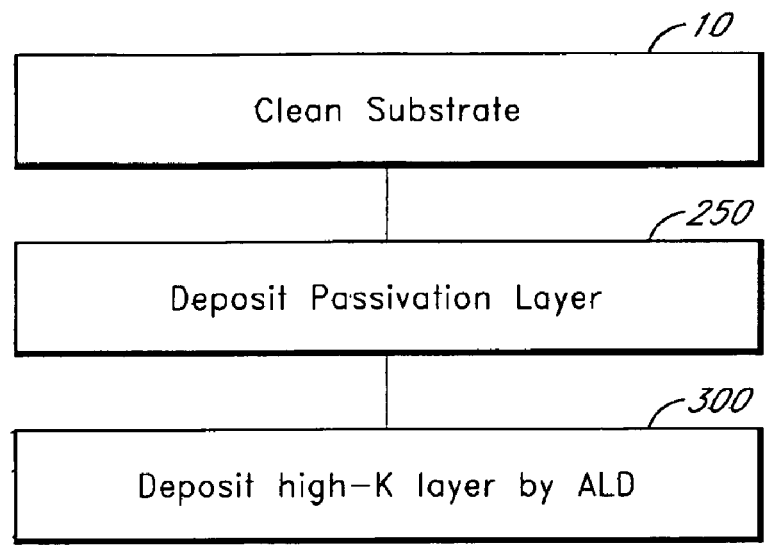
FIG. 3 is a flow chart illustrating a further method for depositing a high-k dielectric layer on a Ge substrate, in which a passivation layer is deposited over a cleaned substrate prior to deposition of the high-k layer.

A further embodiment is illustrated in FIG. 3. In this case, a passivation layer 250 is deposited directly over a cleaned substrate 10. The passivation layer may be, for example, an ultra-thin metal oxide layer. The high-k dielectric layer is deposited 300 over the passivation layer 250. The substrate surface may optionally be etched to remove native oxide (not shown) prior to deposition of the passivation layer 250. Deposition of the passivation layer 250 and deposition of the high-k layer 300 are preferably carried out in situ.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:
1. A method of depositing a thin film on a Ge substrate comprising:
   treating the substrate surface, wherein treating comprises forming an ultra-thin layer of $GeO_x$ or $GeO_xN_y$; and depositing a thin film on the substrate by a first atomic layer deposition (ALD) process using a metalorganic precursor and an oxygen precursor at a temperature lower than about 300° C., wherein the oxygen donor precursor is selected from the group consisting of ozone, oxygen plasma and oxygen radicals.

2. The method of claim 1, wherein the first ALD process is carried out at a temperature less than about 200° C.

3. The method of claim 1, wherein the thin film is a high-k layer.

4. The method of claim 1, wherein the metalorganic precursor does not contain a halide.

5. The method of claim 3, wherein the high-k layer comprises a material selected from the group consisting of $La_{(2-x)}Al_xO_3$, $HfO_2$, $ZrO_2$ and $Al_2O_3$.

6. A method of depositing a thin film on a Ge substrate comprising:
   treating the substrate surface;
   depositing a thin film on the substrate by a first atomic layer deposition (ALD) process using a metalorganic precursor and an oxygen precursor at a temperature lower than about 300° C.; and
   depositing a passivation layer on the substrate after treating and prior to depositing the thin film, wherein the passivation layer is deposited by a second atomic layer deposition (ALD) process different from the first ALD process.

7. The method of claim 6, wherein the second ALD process uses a metalorganic precursor and is carried out at a temperature lower than about 300° C.

8. The method of claim 7, wherein the metalorganic precursor does not contain a halide.

9. The method of claim 6, wherein the passivation layer comprises a metal oxide.

10. The method of claim 9, wherein the metal oxide is selected from the group consisting of $Al_2O_3$, $La_{(2-x)}Al_xO_3$ and MgO.

11. A method of forming a gate stack in an integrated circuit comprising:
   treating a Ge substrate to provide a uniform surface termination on the substrate surface, wherein treating comprises forming an ultra-thin layer of $GeO_x$ or $GeO_xN_y$;
   depositing a passivation layer over the substrate surface by a first atomic layer deposition (ALD) process at a temperature lower than about 300° C., wherein depositing the passivation layer comprises providing an oxygen donor precursor selected from the group consisting of ozone, oxygen plasma and oxygen radicals; and
   depositing a high-k layer over the passivation layer by a second ALD process different from the first ALD process,
   wherein the passivation layer and the high-k layer comprise different materials.

12. The method of claim 11, wherein a metalorganic precursor is used in the first ALD process.

13. The method of claim 12, wherein the metalorganic precursor does not contain a halide.

14. The method of claim 11, wherein a metal halide reactant is used in the second ALD process.

15. The method of claim 11, wherein the second ALD process is carried out at a temperature above about 300° C.

16. The method of claim 11, wherein the first ALD process is carried out at a temperature below about 200° C.

17. The method of claim 11, wherein treating comprises forming a layer of $GeO_x$ on the substrate surface.

18. The method of claim 11 wherein depositing a passivation layer comprises depositing a metal oxide.

19. A method of depositing a high-k dielectric layer on a Ge substrate comprising:
   treating the substrate surface, wherein treating comprises forming an ultra-thin layer of $GeO_x$ or $GeO_xN_y$;
   depositing a passivation layer over the substrate surface by an atomic layer deposition (ALD) process using a metalorganic precursor; and
   depositing a high-k dielectric layer over the passivation layer.

20. The method of claim 19, wherein the passivation layer comprises a metal oxide.

21. The process of claim 19, wherein the high-k dielectric layer is deposited using a metal halide reactant.

22. The process of claim 21, wherein the passivation layer protects the substrate from damage that would otherwise occur during deposition of the high-k dielectric layer.

23. The method of claim 19, wherein the ALD process is carried out at a temperature less than about 300° C.

* * * * *